May 5, 1970 YOICHI KANEKO ET AL 3,510,800

NEGATIVE RESISTANCE OSCILLATOR STABILIZED WITH FUNDAMENTAL AND HARMONIC FREQUENCY CAVITY RESONATORS

Filed June 28, 1968 2 Sheets-Sheet 1

INVENTORS
YOICHI KANEKO,
YOSHIMITSU SASAKI

BY

ATTORNEYS

INVENTORS
YOICHI KANEKO
YOSHIMITSU SASAKI

BY Craig & Antonelli
ATTORNEYS

United States Patent Office 3,510,800

Patented May 5, 1970

3,510,800

NEGATIVE RESISTANCE OSCILLATOR STABILIZED WITH FUNDAMENTAL AND HARMONIC FREQUENCY CAVITY RESONATORS

Yoichi Kaneko, Kokubunji-shi, and Yoshimitsu Sasaki, Fuchu-shi, Japan, assignors to Hitachi, Ltd., Tokyo-to, Japan Filed June 28, 1968, Ser. No. 740,933
Claims priority, application Japan, July 24, 1967, 42/47,205
Int. Cl. H03b 7/14
U.S. Cl. 331—96 10 Claims

ABSTRACT OF THE DISCLOSURE

A stabilized high frequency oscillator equipped with a combined resonator in which a first resonant cavity having a negative resistance element mounted therein is connected to a second cavity via an iris which substantially short-circuits a fundamental component field of oscillation, and said fundamental field is localized and resonated in the first cavity, a high harmonic component field is distributed and resonated in said first and second cavities; either one of said two component fields generated in said resonator being derived therefrom as an output and thus the oscillation frequency of said output component is stabilized by virtue of "pull-in" action of the other component which is confined in said resonator.

Figure 1A:
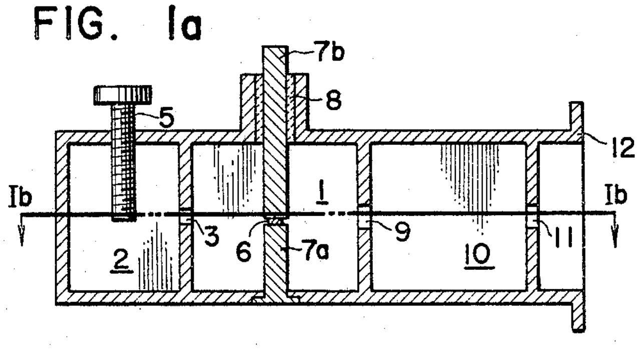

This invention relates to a high frequency oscillator provided with a negative resistance element. In the conventional high frequency oscillator provided with a negative resistance element and a resonator, the Q value of the circuit for stabilizing the oscillation frequency against variation in the power source or load is made high in usual cases.

A light load is to be connected to a high Q circuit. Whereas, in order to obtain the maximum output from the oscillator, it is necessary to connect thereto a heavy load. For this reason, it is impossible to derive a maximum of stable output power only depending on load conditions. Conventionally, therefore, the output must be sacrificed if a desired frequency stability is to be obtained.

The principal object of this invention is to provide a high frequency oscillator, which is provided with a negative resistance element and a resonator and is capable of delivering a maximum of output power with stable frequency.

Another object of this invention is to provide a high frequency oscillator, in which the fundamental component and the higher hamonic component of oscillation are simultaneously generated; either one of said two components being connected to the output load, and the other one of the high Q circuit and; by virtue of "pull-in" action of the latter component, the oscillation frequency of the former component is stabilized independent of the load.

Another object of this invention is to provide a high frequency oscillator, in which both the fundamental component and the higher harmonic component are resonated by a resonator, and the oscillation efficiency of the output component is raised by energy exchange of said two components via the negative resistance element.

Still another object of this invention is to provide a high frequency oscillator, possessing a readily adjustable and easily operable resonator which can be easily tuned to the fundamental component as well as to the higher harmonic component of oscillation, and thus realizing said useful features of the invention.

To achieve said objects, the high frequency oscillator of this invention is provided with a combined resonator in which a first resonant cavity containing a negative resistance element is connected to a second cavity via a coupling iris which substantially short-circuits a high frequency field with resonant frequency $f$ of said first resonant cavity; the fundamental component field with said frequency $f$ is localized and resonated in said first cavity and; and a higher harmonic component field with integral multiple frequency $nf$ is distributed and resonated in said first and second cavities; and, further, said high frequency oscillator is provided with a means for deriving only one of said two components having said frequency $f$ and $nf$.

According to this invention, both the fundamental component and the higher harmonic component of an oscillating field interact simultaneously with the negative resistance in a combined resonator, and only one of the two components is derived for the load. Accordingly, the high frequency energy of the output component is dissipated directly in the load, while the high frequency energy of the other component is confined in the combined resonator. A high Q circuit is formed with respect to the latter component. The component confined in said high Q circuit exchanges energy with the output component via the negative impedance of the element, thereby exerting the high Q circuit effect to the whole oscillating system and thus stabilizing the oscillation frequency of the output component.

The high frequency oscillator of this invention is operated on the principle as has been described. Thus, the negative resistance element should have a negative resistance viewed from two terminals of the element, at a desired frequency in the ON state. Hence an electron tube may be used besides a solid state oscillating element such as Gunn diode, avalanche diode, or the like.

Generally, it is known as to the oscillator that when an external signal with a frequency which is nearly the same as the oscillation frequency or an integral multiple of said oscillation frequency or a reciprocal of the integral multiple of said oscillation frequency is applied thereto, so-called "pull-in" action is effected to cause oscillation in synchronization with the signal frequency. In contrast to the conventional oscillator which effects "pull-in" action by an external signal, the oscillator of this invention is operated on the principle that the oscillation frequency of the output component is stabilized in synchronization with a stable oscillation frequency generated by internal means.

Additional and further specific objects, features and advantages of this invention will hereafter be explained in detail in connection with the accompanying drawings illustrating by way of example several preferred embodiments of this invention. It is to be noted that the same parts and circuit elements are indicated in the drawings by common numerals and symbols.

Figure 1B:
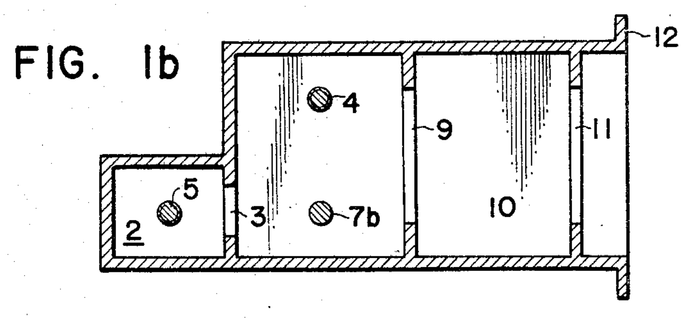

FIG. 1*a* is a longitudinal sectional view and FIG. 1*b* is a lateral sectional view taken along line I*b*—I*b* of FIG. 1*a*, respectively showing an embodiment of this invention, from which the fundamental component of an oscillating field is derived.

Figure 2:
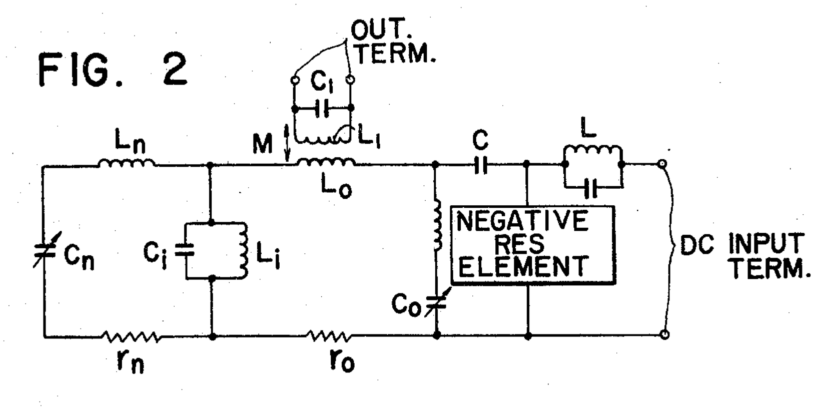

FIG. 2 is a diagram of an analogous lumped constant circuit illustrated for better understanding of the operation of said embodiment.

Figure 3A:
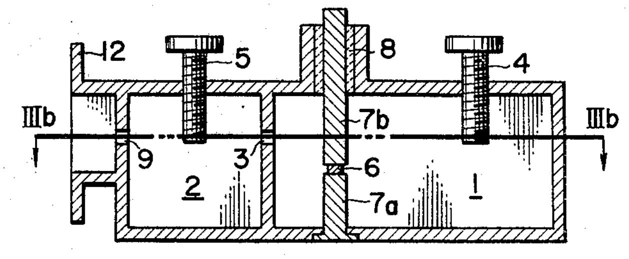
Figure 3B:
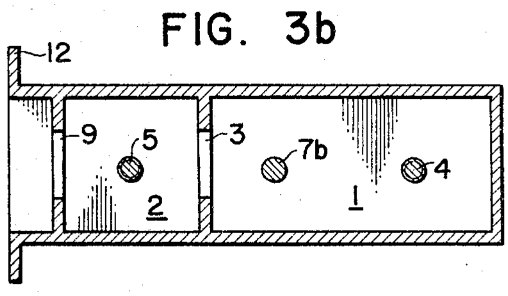

FIG. 3*a* is a longitudinal sectional view and FIG. 3*b* is a lateral sectional view taken along line III*b*—III*b* of FIG. 3*a*, respectively illustrating another embodiment of this invention, from which the higher hormonic component of an oscillating field is derived.

Figure 4:
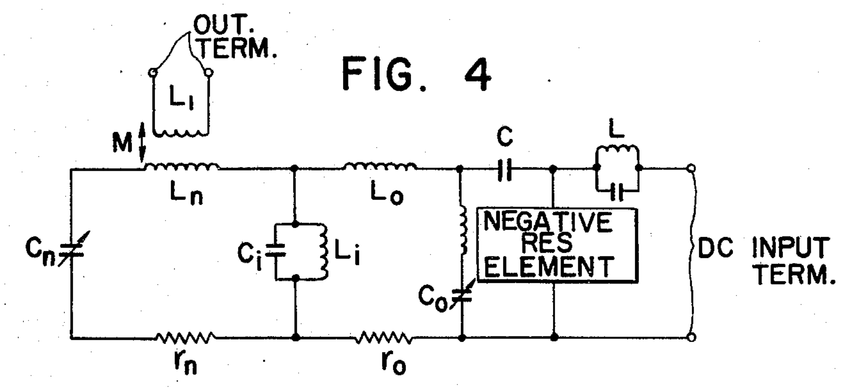

FIG. 4 is a diagram of an analogous lumped constant circuit illustrated for better understanding of the operation of the embodiment as provided in FIG. 3.

FIGS. 1*a* and 1*b* show an embodiment of this invention in which the fundamental component of an oscillating field is derived for the output load; FIG. 1*a* is a longitudinal sectional view of said embodiment, and FIG. 1*b* is a lateral sectional view taken along line I*b*—I*b* of FIG. 1*a*.

Now referring to the figures, a fundamental cavity 1 and a higher harmonic cavity 2 are connected to each other via a coupling iris 3. The cavities 1 and 2 are provided with frequency tuning screws 4 and 5 respectively; and the resonant frequency of the cavities is adjusted by the use of these screws. A negative resistance element 6 i.e., a Gunn oscillating element in case of this embodiment, for example as seen in copending application of K. Kimura et al. Ser. No. 740,932, filed June 28, 1968, and assigned to a common assignee herewith, is inserted between conductor rods **7*a* and 7*b*, which project face to face into the cavity 1. The conductor rod 7*a* is disposed therein so as to be short-circuited DC-wise to the wall of said cavity 1; while, the conductor rod 7*b* is connected to the wall of said cavity 1 via an insulating body 8 and is insulated from the cavity 1 DC-wise but short-circuited thereto in the case of high frequency, thereby preventing leakage of the high frequency field. The wall of the cavity 1 is provided with an output coupling iris 9**.

A filtering cavity 10 is connected to the cavity 1 via said coupling iris 9. Further, an output window 11 facing the coupling iris 9 is provided at the filtering cavity 10. Through this output window, an oscillation output is conducted to the exterior of the device. A flange 12 connects said filtering cavity 10 with an external circuit which includes an output load not schematically shown here. Said coupling iris 9 and output window 11 are arranged at an experimentally suitable distance to each other so as to allow the energy of the fundamental component generated in the fundamental cavity 1 to pass through said coupling iris 9 and output window 11, but to prevent passage of the higher harmonic component therethrough. A band pass filter is formed by the coupling iris 9, filtering cavity 10 and the output window 11, to pass the fundamental component only.

To effect such operation as mentioned above, the position of the coupling iris 9 and the output window 11 mounted at the cavity wall is to be determined in consideration of the higher harmonic component rather than of the fundamental component.

For example, if the opening of the coupling iris 9 is provided at the position of a node of current of a higher harmonic component which is present in the fundamental cavity 1, the coupling of the higher harmonic component with an external circuit can be made small. Generally, however, this position of the opening does not serve as a current node with respect to the fundamental component, and the coupling of the fundamental component with an external circuit is great. Therefore it is possible to allow only the output coupling iris 9 to possess frequency sensitivity for an external circuit, and thus the filtering cavity 10 and the output window 11 may be omitted. The oscillator of this embodiment is provided with the filtering cavity 10 as well as the output window 11, thereby increasing said frequency sensitivity and thus preventing leakage of the higher harmonic component to an external circuit.

When a DC source (not shown schematically) is connected to the conductor rods **7*a* and 7*b* of this embodiment and a specific DC voltage is applied to the Gunn oscillating element 6, oscillation of the fundamental component occurs at the resonant frequency of the cavity 1 and thus a high frequency field is produced. Because the size of the coupling iris 3 is small enought in comparison with the wave length of said fundamental component field, the coupling iris 3 serves substantially as a short-circuit and, as a result, the high frequency energy of the fundamental component does not enter the higher harmonic caivty 2 but goes out from the fundamental cavity 1 to an external circuit via the coupling iris 9. In the instance of said oscillation, a higher harmonic current in addition to the fundamental current is superposed on the element 6**, as is the case of general oscillation.

Said coupling iris 3 is operated as a reactance circuit with respect to the higher harmonic field which corresponds to said higher harmonic current, whereby a combined cavity is formed by the cavities 1 and 2. The combined cavity is turned into a resonant cavity with respect to the higher harmonic component by adjusting the tuning screw 5 and thus producing coincidence between the combined cavity resonant frequency with the desired higher harmonic component frequency.

As described, the fundamental component is not substantially present in the higher harmonic cavity 2 in which the tuning screw 5 is provided. Therefore, the tuning screw 5 will not exert an influence upon the resonant frequency of the fundamental component but will adjust the resonant frequency of the combined cavity with respect to the higher harmonic component.

The high frequency energy of the higher harmonic component resonated in the combined cavity is not allowed to pass through the output coupling iris 9 and the output window 11. Consequently, said high frequency energy is closed in the combined cavity. Both the fundamental component field and the higher harmonic component field interact with the Gunn oscillating element 6 which is contained in the fundamental cavity 1. The relative magnitude of the voltages of the two interacting fields may be changed according to the mounting position of the element 6 in the cavity.

In case the tuning screw 4 to be provided in the cavity 1 is positioned at the node of the higher harmonic component, the resonant frequency of the fundamental component can be adjusted independent of the resonant frequency with respect to the higher harmonic component. Needless to say, the tuning screw 4 may also be located at such a position as will make it possible to adjust concurrently the resonant frequencies of the fundamental component and the higher harmonic component.

An oscillator in accordance with the embodiment of the invention disclosed is adjusted in said manner and is operated to effect oscillation of the fundamental component and higher harmonic component which possess said respective resonance frequencies.

The higher harmonic component of the high frequency energies which interact with the semiconductor element 6 is closed and stored in the combined cavity. Therefore said higher harmonic component is in a high Q circuit state, and a high frequency field with a stable frequency is distributed in the cavity. This stable high frequency field interacts with the element, thereby stabilizing the oscillation frequency of the fundamental component derived for the load. It is particularly desirable that the higher harmonic cavity 2 is made to be a low loss cavity.

For better understanding of the operation of the invention, FIG. 2 shows a diagram of an analogous lumped constant circuit of an ordinary low frequency oscillator $C_o$ and $L_o$ are circuit elements of the lumped constant circuit corresponding to the tuning effect of the fundamental cavity; C*n* and L*n* are also elements corresponding to the tuning effect of the higher harmonic cavity and; M, $C_1$ and $L_1$ are elements for forming a tuned output circuit corresponding to the effect by which the fundamental component is derived through the output coupling iris, filtering cavity and output window. The coupling iris 3 is represented by a parallel circuit of L*i* and C*i*. The fundamental current is substantially short-circuited due to small L*i*. Therefore C*n* and L*n* have no effect on the fundamental current but only on the higher harmonic current. Since the parallel circuit of $C_1$ and $L_1$ is resonant with the fundamental current, the higher harmonic component does not appear at the output terminal but performs stable oscillation in the circuit regardless of the output load. In FIG. 2, $r_0$ and $r_n$ indicate resistances corresponding to the losses of the fundamental cavity and the higher harmonic cavity, respectively and C and L are a DC cut-off capacitor and a high frequency choke inductance respectively.

FIGS. 3*a* and 3*b* show an embodiment of this invention, in which the higher harmonic component of an oscillating field is derived for the output load; FIG. 3*a* is a longitudinal sectional view, and FIG. 3*b* is a sectional view taking along line III*b*—III*b* of FIG. 3*a*. It is to be noted that the same parts and elements as used in FIGS. 1*a* and 1*b* are indicated by the same number references and symbols in FIGS. 3*a* and 3*b*.

In the embodiment as shown in FIGS. 3*a* and 3*b*, an output coupling iris is provided in a higher harmonic cavity 2. When the oscillator of this embodiment is operated, the fundamental component is oscillated at a resonant frequency of the fundamental cavity 1 provided with a tuning screw 4, as in the foregoing embodiment. However, since a coupling iris 3 short-circuits substantially the fundamental field, the high frequency energy of this fundamental component is closed and stored in the fundamental cavity 1, whereby an oscillation is effected at a stable frequency. The higher harmonic component is distributed in the combined cavity of 1 and 2 which has been adjusted to an integral multiple of the resonant frequency of said fundamental component by the use of a tuning screw 5. And, said higher harmonic component is supplied to an external circuit via an output coupling iris 9. The frequency of this higher harmonic component is stabilized by virtue of "pull-in" action of the fundamental component via the Gunn oscillating element, as in the case of the foregoing embodiment for better understanding of the operation of this embodiment, FIG. 4 shows a circuit diagram of an analogous lumped constant circuit of an ordinary low frequency oscillator. L*i* of the parallel circuit (C*i* and L*i*) corresponding to the coupling iris between cavities is small. As a result, with C*n* and L*n* corresponding to the tuning effect of the higher harmonic component, the fundamental current does not flow therethrough but only the higher harmonic current flows, and thus the higher harmonic component is derived for the output load by the coupling circuit ($L_1$, $Ln_1$ and M) corresponding to the output coupling iris.

According to this invention, as explained in detail, the fundamental component and the higher harmonic component are simultaneously generated; one of the two components is closed in a resonator, thereby effecting an oscillation of stable frequency and; by the resultant "pull-in" action, the oscillation frequency of the other component supplied to the output load is stabilized. Therefore, from the oscillator of this invention, a maximum of output with a stable frequency can be derived regardless of load, and thus the defect of the prior art is removed. In the conventional oscillator, only the oscillating field component derived for the load interacts substantially with the oscillating element. Whereas, the oscillator according to this invention is provided with a cavity in which the fundamental component and the higher harmonic component are simultaneously resonated, and both of the two components interact directly with the oscillating element. As a result, it becomes possible to provide an oscillator whose efficiency of oscillation is higher than that of the conventional oscillator by adjusting the relative voltage of the components.

Further, the oscillator according to this invention contains a high Q circuit, thereby reducing the noise of the oscillating output.

Still further, according to this invention, the fundamental component field is localized in the resonator and, therefore, the resonant frequencies of tde cavity for the fundamental component and the higher harmonic component are adjusted independently, as illustrated in the foregoing embodiments. This makes the manufacture and operation easy.

In summary, the oscillator of this invention is simple in structure, easy to manufacture and to handle, and can be operated at a high efficiency, and a maximum of stable and low noise output is obtained therefrom.

While a few preferred embodiments of this invention have been illustrated and described in detail, it is particularly understood that the invention is not limited thereto or thereby but changes and modifications thereof may be made by the skilled persons in the art thereof.

What is claimed is:

1. A high frequency oscillator comprising:

a combined resonator arrangement including a first resonant cavity tunable to a first resonant frequency and a second resonant cavity coupled by way of a first coupling iris to said first resonant cavity and tunable to a second resonant frequency which is a higher harmonic of said first resonant frequency, said first coupling iris being effective to short circuit said first resonant frequency, negative resistance means for generating an oscillating field in said first resonant cavity at said first and second resonant frequencies and in said second resonant cavity at only said second resonant frequency, and output means connected to said combined resonator for deriving therefrom only one of said first and second resonant frequencies to the exclusion of the other resonant frequency, whereby the frequency of the derived output is stabilized by virtue of the pull-in action of the other frequency in the combined resonator.

2. A high frequency oscillator as defined in claim 1 wherein said output means includes wave-guide means coupled to said first resonant cavity by way of a second coupling iris which prevents passage of said second resonant frequency, said one resonant frequency forming the output of said resonator being said first resonant frequency.

3. A high frequency oscillator as defined in claim 2 wherein said wave-guide means includes filter means for passing said first resonant frequency while blocking said second resonant frequency.

4. A high frequency oscillator as defined in claim 1 wherein said output means includes wave-guide means coupled to said second resonant cavity for passing said second resonant frequency to the exclusion of said first resonant frequency.

5. A high frequency oscillator as defined in claim 1 wherein said output means includes a filtering cavity coupled to said first resonant cavity by way of a second coupling iris and having an output window, said filtering cavity including said second coupling iris and said window forming a band pass filter permitting passage of said one resonant frequency only.

6. A high frequency oscillator as defined in claim 5 wherein said filtering cavity is capable of passing only said first resonant frequency.

7. A high frequency oscillator as defined in claim 5 wherein said filtering cavity is capable of passing only said second resonant frequency.

8. A high frequency oscillator as defined in claim 1 wherein said negative resistance means is provided in the form of a semiconductor oscillator element positioned in said first resonant cavity.

9. A high frequency oscillator as defined in claim 8 wherein said semincondutcor oscillator element is a device which performs Gunn oscillation.

10. A high frequency oscillator as defined in claim 1 wherein said negative resistance means is provided in the form of an electron discharge device having negative resistance positioned in said first resonant cavity.

References Cited

UNITED STATES PATENTS

| | | | |
|---|---|---|---|
| 3,189,843 | 6/1965 | Bruck | 331—97 X |
| 3,254,309 | 5/1966 | Miller | 331—96 X |
| 3,435,374 | 3/1969 | Whitten | 331—175 X |

ROY LAKE, Primary Examiner

S. H. GRIMM, Assistant Examiner

U.S. Cl. X.R.

331—76, 107, 175